United States Patent

Raad

Patent Number: 5,959,913
Date of Patent: Sep. 28, 1999

[54] DEVICE AND METHOD FOR STRESS TESTING A SEMICONDUCTOR MEMORY

[75] Inventor: George B. Raad, Boise, Id.

[73] Assignee: Micron Technology, Inc., Boise, Id.

[21] Appl. No.: 09/026,245

[22] Filed: Feb. 19, 1998

[51] Int. Cl.[6] .................................................. G11C 7/00
[52] U.S. Cl. ........................................ 365/201; 365/190
[58] Field of Search .................................. 365/201, 190, 365/207; 371/21.1

[56] References Cited

U.S. PATENT DOCUMENTS

| | | | |
|---|---|---|---|
| 5,034,923 | 7/1991 | Kuo et al. | 365/201 |
| 5,255,230 | 10/1993 | Chan et al. | 365/201 |
| 5,276,647 | 1/1994 | Matsui et al. | 365/201 |
| 5,339,273 | 8/1994 | Taguchi | 365/201 |
| 5,396,465 | 3/1995 | Oh et al. | 365/201 |
| 5,469,393 | 11/1995 | Thomann | 365/201 |
| 5,568,435 | 10/1996 | Marr | 365/201 |
| 5,586,080 | 12/1996 | Raad et al. | 365/230.06 |

*Primary Examiner*—Son T. Dinh
*Attorney, Agent, or Firm*—Trask, Britt & Rossa

[57] ABSTRACT

A DRAM is stress tested by writing a logic bit in a weakened state from a sense amplifier of the DRAM to a sub-array of the DRAM. This is accomplished by reducing an upper rail voltage supplied to a P-sense amp in the sense amplifier and increasing a lower rail voltage supplied to an N-sense amp in the sense amplifier, or by operating isolation NMOS transistors through which a differential voltage representative of the logic bit passes from the sense amplifier to the sub-array at less than a full activation level. Once the logic bit is written to the sub-array in a weakened state, it is then read back out to stress the DRAM and thereby identify weak sense amplifiers and DRAM cells in the DRAM.

34 Claims, 4 Drawing Sheets

DEVICE AND METHOD FOR STRESS TESTING A SEMICONDUCTOR MEMORY

BACKGROUND OF THE INVENTION

1. Field of the Invention

This invention relates in general to semiconductor memories such as Dynamic Random Access Memories (DRAMs) and, more specifically, to stress testing of such memories.

2. State of the Art

DRAMs are typically subjected to stress testing during manufacturing. Such testing, also referred to as margin testing, includes various procedures for identifying DRAM cells that are unable to store sufficient charge (referred to as "weak" cells) and for identifying sense amplifiers that lack sufficient sensitivity or gain (referred to as "weak" sense amplifiers).

One conventional method for stress testing DRAMs involves reducing their supply voltage during testing. This reduces the charge that can be written to their memory cells and also reduces the gain of their sense amplifiers. Weak memory cells are then identified by misreads resulting from the reduced charge written to the cells. Also, weak sense amplifiers are identified by misreads resulting from their lacking the necessary sensitivity or gain to correctly read the reduced charge written to the memory cells.

With the increasing use of 2.0 volt DRAM process technology, it is becoming clear that a new device and method for stress testing DRAMs is needed. This is because peripheral circuitry in 2.0 volt DRAMs, which is necessary for external testing equipment to interact with the DRAMs during stress testing, typically begins to shut down at a supply voltage of about 1.5 volts, so that reducing the supply voltage of such DRAMs significantly below 2.0 volts is not a viable means of stress testing the DRAMs.

Therefore, there is a need in the art for a new device and method for stress testing DRAMs and other semiconductor memories. Such a device and method should provide a viable means for testing 2.0 volt DRAMs.

SUMMARY OF THE INVENTION

In accordance with the invention, a semiconductor memory, such as a Dynamic Random Access Memory (DRAM), is stress tested by writing a logic bit in a weakened state from a sense amplifier of the semiconductor memory to a memory array of the semiconductor memory. This can be accomplished by reducing the rail-to-rail potential of the sense amplifier, such as by reducing an upper rail voltage supplied to a P-sense amp in the sense amplifier and increasing a lower rail voltage supplied to an N-sense amp in the sense amplifier. Alternatively, it can be accomplished by operating isolation switches through which a differential voltage representative of the logic bit passes from the sense amplifier to the memory array at less than a full activation level, thereby reducing the differential voltage passed to the memory array through the isolation switches. When the isolation switches are NMOS transistors, for example, the differential voltage decreases as a result of the latter method by at least a threshold voltage of one of the transistors as it passes through on its way to the memory array. Once the logic bit is written to the memory array in a weakened state, it is then read back out so the weakened state of the bit stresses the semiconductor memory.

Thus, the invention stress tests DRAMs and other semiconductor memories in a new way that is suitable for 2.0 volt DRAMs because it does not require the reduction in their supply voltage that can be a problem for the conventional stress testing method previously described.

In accordance with another embodiment of the invention, a device for stress testing a semiconductor memory includes circuitry for causing a sense amplifier of the semiconductor memory to operate as described above.

In still further embodiments of the invention, a semiconductor memory, an electronic system, and a semiconductor wafer incorporate the previously described inventive device.

DETAILED DESCRIPTION OF THE ILLUSTRATED EMBODIMENTS

Figure 1:
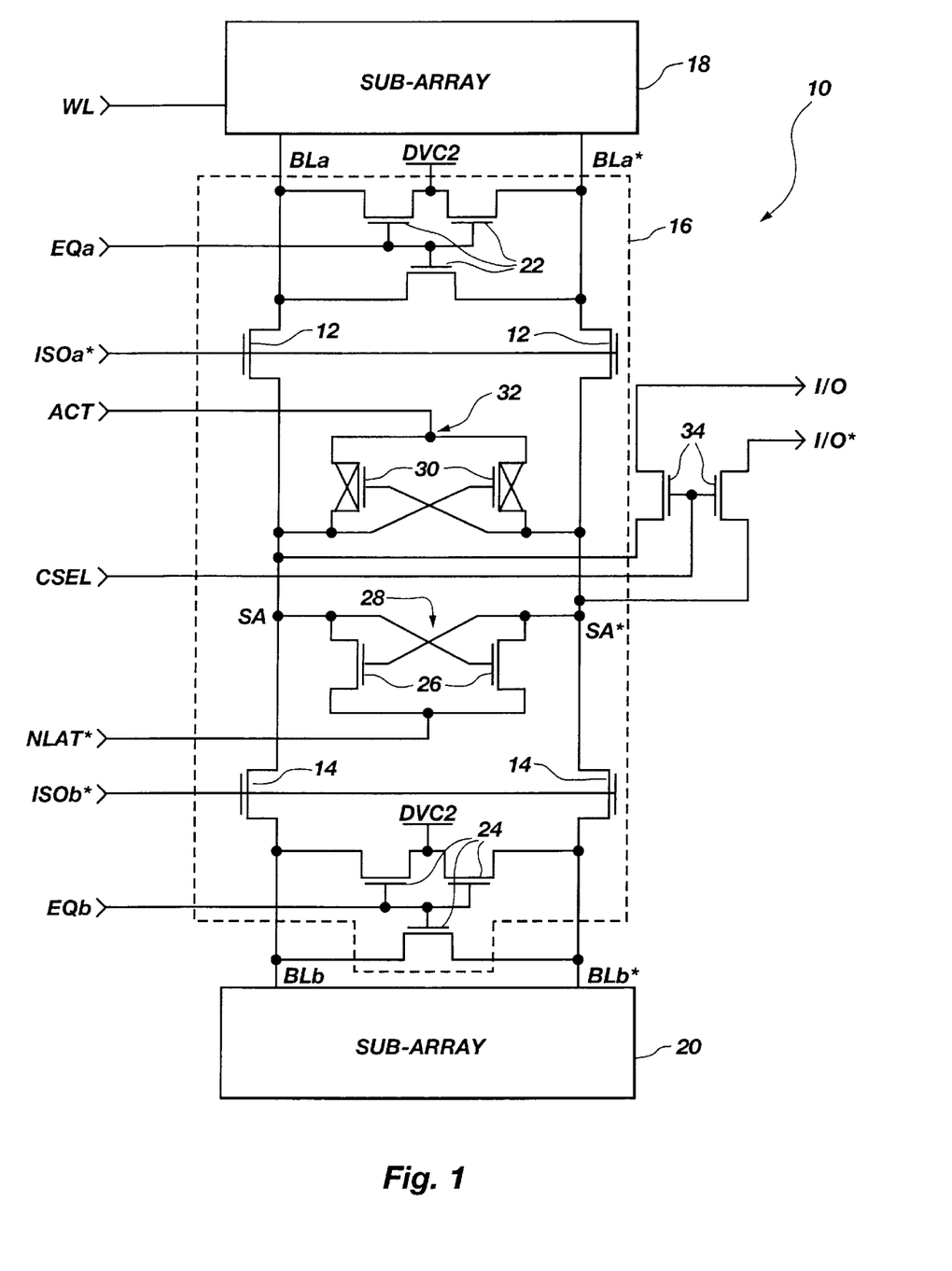
FIG. 1 is a block diagram and circuit schematic of a Dynamic Random Access Memory (DRAM) including a pair of sub-arrays and their associated sense amplifier implementing the invention.
Figure 2A:
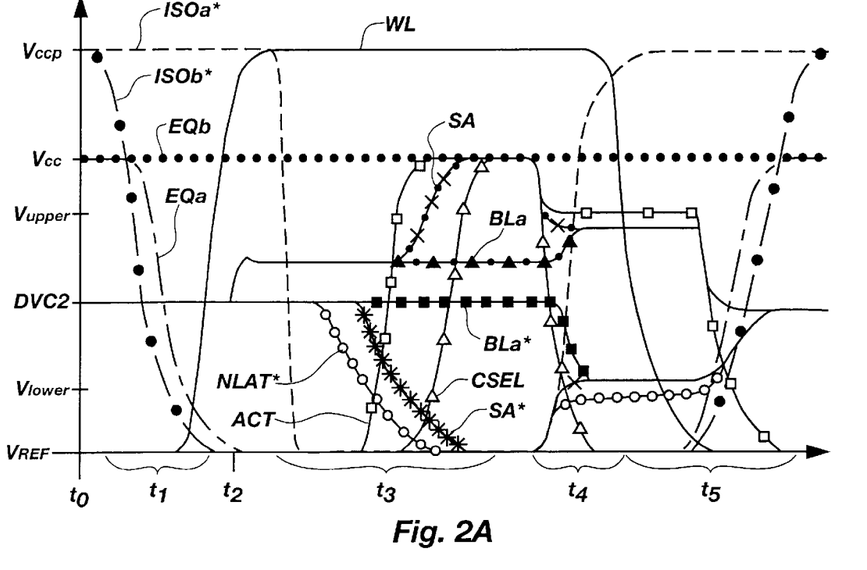
FIGS. 2A and 2B are graphs of signals that cause the sense amplifier of FIG. 1 to operate in accordance with the invention.

As shown in FIGS. 1 and 2A, a Dynamic Random Access Memory (DRAM) 10 begins a stress test read cycle in accordance with the invention in a steady state at time $t_0$ with a pair of isolation signals ISOa* and ISOb* fully activating two pairs of isolation NMOS transistors 12 and 14 in a sense amplifier 16 of the DRAM 10 with a wordline voltage $V_{CCP}$ (typically about 3.7 volts in a 2.0 volt DRAM). The activated transistors 12 and 14 provide a conductive path between complementary sense nodes SA and SA* of the sense amplifier 16 and sub-arrays 18 and 20 of the DRAM 10 along complementary bitlines BLa, BLa*, BLb, and BLb*. At the same time, a pair of equalization signals EQa and EQb are activating equalization NMOS transistors 22 and 24 to equalize voltages on the bitlines BLa, BLa*, BLb, and BLb* and on the sense nodes SA and SA* to an intermediate voltage DVC2 that is equal to one half of a supply voltage $V_{cc}$ supplied to the DRAM 10. It will be understood by those having skill in the field of this invention that although the invention will be described with respect to a DRAM, it is also applicable to other semiconductor memories requiring stress testing.

When the sub-array 18, for example, is to be stress tested, the isolation signal ISOb* drops during a time period $t_1$ to deactivate isolation NMOS transistors 14, thereby isolating the sense nodes SA and SA* of the sense amplifier 16 from the sub-array 20. The equalization signal EQa also drops to deactivate the equalization NMOS transistors 22, thereby allowing the bitlines BLa and BLa*, and hence the sense nodes SA and SA*, to take on voltages independently of one another.

At a time $t_2$, a rising wordline WL of the sub-array 18 accesses a DRAM cell (not shown) in the sub-array 18. The DRAM cell then dumps its stored charge representative of a logic "1" bit, for example, onto the bitline BLa, causing the voltage on the bitline BLa and the voltage on the sense node SA to rise by about 200 mV.

During a time period $t_3$, a dropping isolation signal ISOa* deactivates isolation NMOS transistors 12, thereby isolating the sense nodes SA and SA* from the bitlines BLa and BLa*. A dropping lower rail voltage NLAT* also causes NMOS transistors 26 of an N-sense amp 28 of the sense amplifier 16 to pull the sense node SA* low. Similarly, a rising upper rail voltage ACT causes PMOS transistors 30 of a P-sense amp 32 of the sense amplifier 16 to pull the sense node SA high. Once the sense nodes SA and SA* are separated by the N-sense amp 28 and the P-sense amp 32, a column selection signal CSEL activates column select NMOS transistors 34 to drive the separated voltages on the sense nodes SA and SA* onto an internal data bus I/O and I/O* of the DRAM 10, where they are output to external circuitry (see FIG. 5).

During a time period $t_4$, the column selection signal CSEL drops to deactivate the column select NMOS transistors 34, thereby isolating the sense nodes SA and SA* from the internal data bus I/O and I/O*. Also, the isolation signal ISOa* rises back to the wordline voltage $V_{CCP}$ to reactivate the isolation NMOS transistors 12, thereby reopening a conductive path between the sense nodes SA and SA* and the bitlines BLa and BLa*. Further, the upper rail voltage ACT drops to a voltage $V_{UPPER}$, causing the sense node SA to drop, and the bitline BLa to rise, approximately to the voltage $V_{UPPER}$. At the same time, the lower rail voltage NLAT* rises to a voltage $V_{LOWER}$, causing the sense node SA* to rise, and the bitline BLa* to drop, approximately to the voltage $V_{LOWER}$. The voltages $V_{UPPER}$ and $V_{LOWER}$ on the bitlines BLa and BLa* are then conducted back to the sub-array 18 for storage therein. As a result, the logic "1" bit previously read (at time $t_2$ above) from the DRAM cell (not shown) in the sub-array 18, and now represented by the voltages $V_{UPPER}$ and $V_{LOWER}$ on the bitlines BLa and BLa*, is written back to the sub-array 18 in a weakened state.

During a time period $t_5$, the DRAM 10 finishes its stress test read cycle and returns to its steady state. More specifically, the wordline WL drops to close off access to the DRAM cell (not shown) in the sub-array 18, the upper rail voltage ACT drops to a ground voltage $V_{REF}$ to deactivate the P-sense amp 32, the lower rail voltage NLAT* rises to the intermediate voltage DVC2 to deactivate the N-sense amp 28, the isolation signal ISOb* returns to the wordline voltage $V_{CCP}$ to activate the isolation NMOS transistors 14 and connect the sub-array 20 to the sense amplifier 16, and the equalization signal EQa rises to activate the equalization transistors 22 and equalize the voltages on the bitlines BLa, BLa*, BLb, and BLb* and the sense nodes SA and SA* to the intermediate voltage DVC2.

Once the logic "1" bit is stored in the sub-array 18 in a weakened state, a subsequent stress test read cycle attempts to read the weakened logic "1" bit out of the sub-array 18. When the DRAM cell storing the weakened logic "1" bit is weak, or the sense amplifier 16 is weak, a misread of the weakened logic "1" bit may occur. This misread serves to identify the weakened DRAM cell or sense amplifier 16. Of course, it should be understood that the invention also works with logic "0" bits.

Figure 2B:
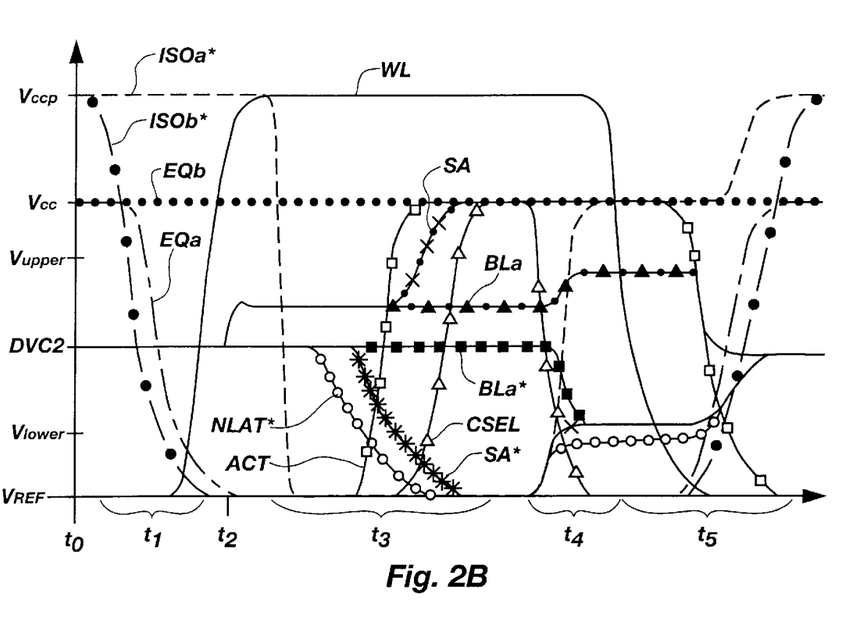

Referring now to FIGS. 1 and 2B, in another embodiment of the invention, the DRAM 10 operates in the same manner as described above through time periods $t_0$, $t_1$, $t_2$, and $t_3$. During a time period $t_4$, the column selection signal CSEL drops to deactivate the column select NMOS transistors 34, thereby isolating the sense nodes SA and SA* from the internal data bus I/O and I/O*. Also, the isolation signal ISOa* rises to the supply voltage $V_{CC}$ to reactivate the isolation NMOS transistors 12 at less than a full activation level. This pulls the bitline BLa up to a voltage $V_{UPPER}$ that is below the supply voltage $V_{CC}$ by at least a threshold voltage $V_T$ of the transistors 12. At the same time, the lower rail voltage NLAT* rises to a voltage $V_{LOWER}$, causing the sense node SA* to rise, and the bitline BLa* to drop, approximately to the voltage $V_{LOWER}$. The voltages $V_{UPPER}$ and $V_{LOWER}$ on the bitlines BLa and BLa* are then conducted back to the sub-array 18 for storage therein. As a result, the logic "1" bit previously read (at time $t_2$) from the DRAM cell (not shown) in the sub-array 18, and now represented by the voltages $V_{UPPER}$ and $V_{LOWER}$ on the bitlines BLa and BLa*, is written back to the sub-array 18 in a weakened state.

During a time period $t_5$, the DRAM 10 finishes its stress test read cycle and returns to its steady state. More specifically, the wordline WL drops to close off access to the DRAM cell (not shown) in the sub-array 18, the upper rail voltage ACT drops to ground $V_{REF}$ to deactivate the P-sense amp 32, the lower rail voltage NLAT* rises to the intermediate voltage DVC2 to deactivate the N-sense amp 28, the isolation signal ISOb* returns to the wordline voltage $V_{CCP}$ to fully activate the isolation NMOS transistors 14 and connect the sub-array 20 to the sense amplifier 16, the isolation signal ISOa* returns to the wordline voltage $V_{CCP}$ to fully activate the isolation NMOS transistors 12, and the equalization signal EQa rises to activate the equalization transistors 22 and equalize the voltages on the bitlines BLa, BLa*, BLb, and BLb* and the sense nodes SA and SA* to the intermediate voltage DVC2.

Again, once the logic "1" bit is stored in the sub-array 18 in a weakened state, a subsequent stress test read cycle attempts to read the weakened logic "1" bit out of the sub-array 18. When the DRAM cell storing the weakened logic "1" bit is weak, or the sense amplifier 16 is weak, a misread of the weakened logic "1" bit may occur. This misread serves to identify the weakened DRAM cell or sense amplifier 16.

Figure 3:
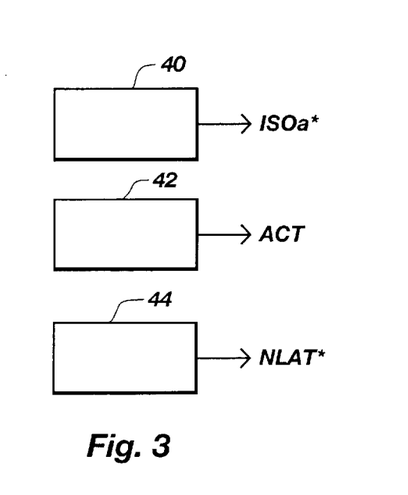
FIG. 3 is a block diagram of circuitry for generating some of the signals of FIGS. 2A and 2B.

As shown in FIG. 3, the invention includes circuitry 40, 42, and 44 for providing the isolation signal ISOa*, the upper rail voltage ACT, and the lower rail voltage NLAT* in the inventive manner illustrated in FIGS. 2A and 2B.

Figure 4:
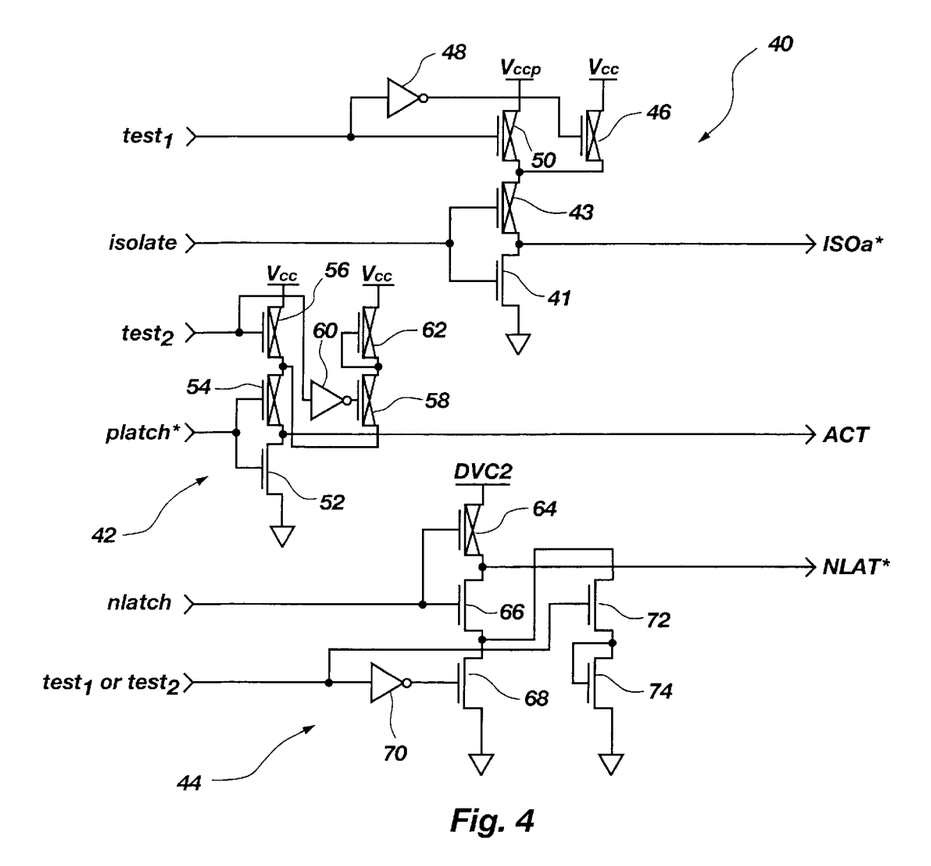
FIG. 4 is a circuit schematic showing the circuitry of FIG. 3 in more detail.

As shown in FIG. 4 in more detail, the isolation signal ISOa* of the circuitry 40 is active when an isolate control signal ISOLATE activates an NMOS transistor 41. When the isolate control signal ISOLATE is inactive, it turns on a PMOS transistor 43, thereby pulling the isolation signal ISOa* up to either the supply voltage $V_{CC}$ or the wordline voltage $V_{CCP}$, depending on whether a test activation signal $TEST_1$ is active and turns on a PMOS transistor 46 through an inverter 48, or is inactive and turns on a PMOS transistor 50.

The upper rail voltage ACT of the circuitry 42 is inactive when an inactive control signal PLATCH* activates an NMOS transistor 52. When the control signal PLATCH* is active, it turns on a PMOS transistor 54, thereby pulling the upper rail voltage ACT up to the supply voltage $V_{CC}$ if an inactive test activation signal $TEST_2$ activates a PMOS transistor 56. Instead, if the test activation signal $TEST_2$ is active, it turns on a PMOS transistor 58 through an inverter 60, thereby pulling the upper rail voltage ACT up to the supply voltage $V_{CC}$ less about a threshold voltage VT drop (i.e., $ACT=V_{CC}-V_T$) caused by a diode-connected PMOS transistor 62.

The lower rail voltage NLAT* of the circuitry 44 is inactive when an inactive control signal NLATCH activates a PMOS transistor 64. When the control signal NLATCH is active, it turns on an NMOS transistor 66, thereby pulling the lower rail voltage NLAT* down to ground voltage if an inactive test activation signal (TEST$_1$ or TEST$_2$) activates an NMOS transistor 68 through an inverter 70. Instead, if the test activation signal (TEST$_1$ or TEST$_2$) is active, it turns on an NMOS transistor 72, thereby pulling the lower rail voltage NLAT* down to ground voltage plus about a threshold voltage V$_T$ drop (i.e., NLAT*=ground+V$_T$) caused by a diode-connected NMOS transistor 74. It should be understood that a wide variety of other circuitry will also work in implementing the circuitry 40, 42, and 44 in the invention.

Figure 5:
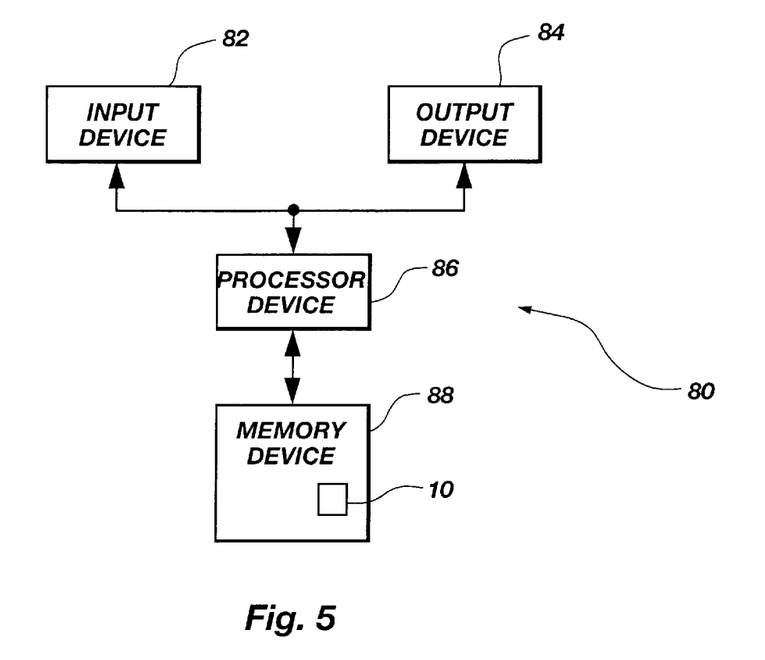
FIG. 5 is a block diagram of an electronic system incorporating the DRAM of FIG. 1.

As shown in FIG. 5, an electronic system 80 includes an input device 82, an output device 84, a processor device 86, and a memory device 88 incorporating the DRAM 10 of FIG. 1. Of course, any of the input, output, and processor devices 82, 84, and 86 may also incorporate the DRAM 10 of FIG. 1.

Figure 6:
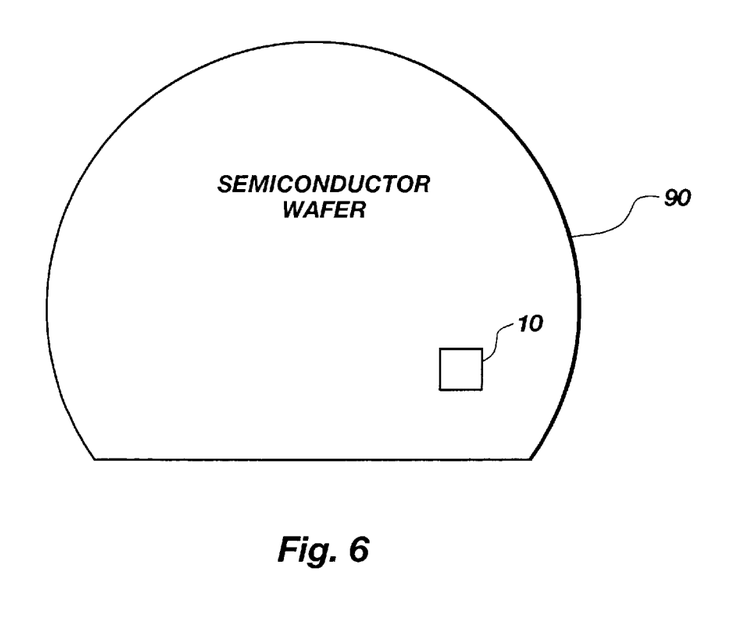
FIG. 6 is a diagram of a semiconductor wafer on which the DRAM of FIG. 1 is fabricated.

As shown in FIG. 6, the DRAM 10 of FIG. 1 is fabricated on the surface of a semiconductor wafer 90. The wafer 90 may comprise a sliced wafer of silicon, or may comprise any other suitable substrate, including, for example, a Silicon-on-Sapphire (SOS), Silicon-on-Insulator (SOI), or Silicon-on-Glass (SOG) substrate.

Although the invention has been described with reference to particular embodiments, it is not limited to these described embodiments. Rather, the invention is limited only by the appended claims, which include within their scope all equivalent devices or methods that operate according to the principles of the invention as described.

I claim:

1. A method of stress testing a semiconductor memory, the method comprising:
   connecting a pair of complementary sense nodes in a sense amplifier of the semiconductor memory to a memory array of the semiconductor memory;
   accessing a logic bit stored in the memory array;
   conducting voltages, at least one of which is representative of the accessed logic bit, from the memory array to the sense nodes;
   isolating the sense nodes from the memory array;
   amplifying a difference in voltage between the sense nodes;
   applying the voltages on the sense nodes to an internal data bus of the semiconductor memory;
   decreasing the amplified difference in voltage between the sense nodes;
   reconnecting the sense nodes to the memory array;
   conducting the voltages on the sense nodes to the memory array to write the logic bit back to the array in a weakened state; and
   stress testing the semiconductor memory by reading the logic bit in its weakened state.

2. The method of claim 1 wherein the step of connecting the sense nodes in the sense amplifier to the memory array comprises activating a pair of isolation NMOS transistors.

3. The method of claim 1 wherein the step of accessing the logic bit includes firing a wordline associated with the memory array.

4. The method of claim 1 wherein the step of conducting the voltages from the memory array to the sense nodes comprises conducting the voltages along bitlines and through activated isolation NMOS transistors.

5. The method of claim 1 wherein the step of isolating the sense nodes comprises deactivating a pair of isolation NMOS transistors.

6. The method of claim 1 wherein the step of amplifying the difference in voltage between the sense nodes comprises pulling one of the sense nodes up toward a supply voltage of the semiconductor memory and the other of the sense nodes down toward a reference voltage of the semiconductor memory.

7. The method of claim 1 wherein the step of applying the voltages to the internal data bus comprises activating a pair of column selection NMOS transistors.

8. The method of claim 1 wherein the step of decreasing the amplified difference in voltage between the sense nodes comprises at least one of decreasing an upper rail voltage supplied to a P-sense amp of the sense amplifier and increasing a lower rail voltage supplied to an N-sense amp of the sense amplifier.

9. The method of claim 1 wherein the step of reconnecting the sense nodes to the memory array comprises reactivating a pair of isolation NMOS transistors between the sense nodes and the memory array.

10. The method of claim 1 wherein the step of conducting the voltages on the sense nodes to the memory array comprises conducting the voltages through a pair of reactivated isolation NMOS transistors and a pair of bitlines.

11. A method of stress testing a semiconductor memory, the method comprising:
    accessing a logic bit stored in a memory array of the semiconductor memory;
    receiving a differential voltage representative of the accessed logic bit from the memory array on sense nodes of the semiconductor memory;
    amplifying the differential voltage on the sense nodes;
    applying the amplified differential voltage on the sense nodes to an internal data bus of the semiconductor memory in isolation from the memory array;
    reducing the amplified differential voltage on the sense nodes;
    providing the reduced differential voltage on the sense nodes to the memory array to write the logic bit back to the memory array in a weakened state; and
    stress testing the semiconductor memory by reading the logic bit in its weakened state.

12. The method of claim 11 wherein the step of receiving the differential voltage comprises receiving the differential voltage between a pair of bitlines associated with the memory array.

13. The method of claim 11 wherein the step of applying the amplified differential voltage to the internal data bus in isolation from the memory array includes deactivating a pair of isolation NMOS transistors between the sense nodes and the memory array.

14. A method of writing a logic bit in a weakened state to a memory array of a semiconductor memory during stress testing of the semiconductor memory, the method comprising:
    decreasing a rail-to-rail potential of a sense amplifier of the semiconductor memory while maintaining a supply voltage of the semiconductor memory substantially constant; and
    writing the logic bit in a weakened state from the sense amplifier to the memory array.

15. The method of claim 14 wherein the step of decreasing the rail-to-rail potential of the sense amplifier comprises at least one of decreasing an upper rail voltage supplied to a P-sense amp of the sense amplifier and increasing a lower rail voltage supplied to an N-sense amp of the sense amplifier while maintaining the supply voltage of the semiconductor memory substantially constant.

16. The method of claim 14 wherein the step of writing the logic bit from the sense amplifier to the memory array comprises conducting a differential voltage representative of the logic bit from sense nodes of the sense amplifier, through a pair of activated isolation NMOS transistors, along a pair of bitlines associated with the memory array, to the memory array.

17. A method of stress testing a semiconductor memory, the method comprising:

activating a pair of isolation switches in a sense amplifier of the semiconductor memory to connect a pair of complementary sense nodes in the sense amplifier to a memory array of the semiconductor memory;

accessing a logic bit stored in the memory array;

conducting voltages, at least one of which is representative of the accessed logic bit, from the memory array to the sense nodes through the activated isolation switches;

deactivating the isolation switches to isolate the sense nodes from the memory array;

amplifying a difference in voltage between the sense nodes;

applying the voltages on the sense nodes to an internal data bus of the semiconductor memory;

reactivating the isolation switches at a reduced activation level to reconnect the sense nodes to the memory array;

conducting at least one of the voltages on the sense nodes to the memory array at a reduced level through at least one of the reactivated isolation switches to write the logic bit back to the memory array in a weakened state; and stress testing the semiconductor memory by reading the logic bit in its weakened state.

18. The method of claim 17 wherein the step of activating the isolation switches comprises activating a pair of isolation NMOS transistors.

19. The method of claim 17 wherein the step of reactivating the isolation switches at a reduced activation level comprises reactivating a pair of isolation NMOS transistors with a reduced gate voltage.

20. The method of claim 17 wherein the step of conducting at least one of the voltages on the sense nodes to the memory array at a reduced level comprises conducting the voltages through reactivated isolation NMOS transistors so the at least one of the voltages drops by a threshold voltage of one of the isolation NMOS transistors.

21. A method of stress testing a semiconductor memory, the method comprising:

accessing a logic bit stored in a memory array of the semiconductor memory;

receiving a differential voltage representative of the accessed logic bit from the memory array on sense nodes of the semiconductor memory;

amplifying the differential voltage on the sense nodes;

applying the amplified differential voltage to an internal data bus of the semiconductor memory in isolation from the memory array;

providing the amplified differential voltage on the sense nodes to the memory array through isolation switches of the semiconductor memory operating at less than a full activation level to write the logic bit back to the memory array in a weakened state; and stress testing the semiconductor memory by reading the logic bit in its weakened state.

22. A method of writing a logic bit in a weakened state to a memory array of a semiconductor memory during stress testing of the semiconductor memory, the method comprising:

operating isolation switches through which a differential voltage representative of the logic bit passes on its way to the memory array at less than a full activation level during stress testing of the semiconductor memory; and conducting the differential voltage at a reduced level through the isolation switches to the memory array to write the logic bit to the memory array in a weakened state.

23. A device for writing a logic bit in a weakened state to a memory array of a semiconductor memory during stress testing of the semiconductor memory, the device comprising:

a sense amplifier including a pair of sense nodes on which a differential voltage representative of the logic bit can be present;

circuitry coupled to the sense amplifier for causing the sense amplifier to reduce the differential voltage on its sense nodes during stress testing of the semiconductor memory while a supply voltage of the semiconductor memory is maintained substantially constant; and circuitry coupled to the sense amplifier for causing the sense amplifier to switchably couple the sense nodes to the memory array during stress testing of the semiconductor memory to conduct the reduced differential voltage on the sense nodes to the memory array in order to write the logic bit in a weakened state to the memory array.

24. The device of claim 23 wherein the sense amplifier includes a P-sense amp and an N-sense amp.

25. The device of claim 24 wherein the circuitry for causing the sense amplifier to reduce the differential voltage comprises circuitry for supplying a reduced upper rail voltage to the P-sense amp of the sense amplifier and for supplying an increased lower rail voltage to the N-sense amp of the sense amplifier.

26. The device of claim 23 wherein the sense amplifier further includes a pair of isolation NMOS transistors, wherein the circuitry for causing the sense amplifier to switchably couple the sense nodes to the memory array comprises circuitry for activating the isolation NMOS transistors.

27. A semiconductor memory comprising:

a memory array;

a sense amplifier including a pair of sense nodes on which a differential voltage representative of a logic bit can be present;

circuitry coupled to the sense amplifier for causing the sense amplifier to reduce the differential voltage on its sense nodes during stress testing of the semiconductor memory while a supply voltage of the semiconductor memory is maintained substantially constant; and circuitry coupled to the sense amplifier and the memory array for switchably coupling the sense nodes to the memory array during stress testing of the semiconductor memory to conduct the reduced differential voltage on the sense nodes to the memory array in order to write the logic bit in a weakened state to the memory array.

28. The semiconductor memory of claim 27 wherein the memory array comprises a Dynamic Random Access Memory (DRAM) array.

29. An electronic system comprising an input device, an output device, a memory device, and a processor device coupled to the input, output, and memory devices, at least one of the input, output, memory, and processor devices comprising a semiconductor memory including:

a memory array;

a sense amplifier including a pair of sense nodes on which a differential voltage representative of a logic bit can be present;

circuitry coupled to the sense amplifier for causing the sense amplifier to reduce the differential voltage on its sense nodes during stress testing of the semiconductor memory while a supply voltage of the semiconductor memory is maintained substantially constant; and circuitry coupled to the sense amplifier and the memory array for switchably coupling the sense nodes to the memory array during stress testing of the semiconductor memory to conduct the reduced differential voltage on the sense nodes to the memory array in order to write the logic bit in a weakened state to the array.

30. A semiconductor wafer on which is fabricated a semiconductor memory comprising:

a memory array;

a sense amplifier including a pair of sense nodes on which a differential voltage representative of a logic bit can be present;

circuitry coupled to the sense amplifier for causing the sense amplifier to reduce the differential voltage on its sense nodes during stress testing of the semiconductor memory while a supply voltage of the semiconductor memory is maintained substantially constant; and circuitry coupled to the sense amplifier and the memory array for switchably coupling the sense nodes to the memory array during stress testing of the semiconductor memory to conduct the reduced differential voltage on the sense nodes to the memory array in order to write the logic bit in a weakened state to the memory array.

31. A device for writing a logic bit in a weakened state to a memory array of a semiconductor memory during stress testing of the semiconductor memory, the device comprising:

a sense amplifier including a pair of sense nodes on which voltages, at least one of which is representative of the logic bit, can be present, and a pair of isolation switches for coupling the sense nodes to the memory array; and circuitry coupled to the sense amplifier for operating the isolation switches at less than a full activation level during stress testing of the semiconductor memory to conduct at least one of the voltages on the sense nodes at a reduced level through at least one of the isolation switches to the memory array in order to write the logic bit in a weakened state to the memory array.

32. A semiconductor memory comprising:

a memory array;

a sense amplifier including a pair of sense nodes on which voltages, at least one of which is representative of a logic bit, can be present, and a pair of isolation switches coupled between the sense nodes and the memory array; and circuitry coupled to the sense amplifier for operating the isolation switches at less than a full activation level during stress testing of the semiconductor memory to conduct at least one of the voltages on the sense nodes at a reduced level through at least one of the isolation switches to the memory array in order to write the logic bit in a weakened state to the memory array.

33. An electronic system comprising an input device, an output device, a memory device, and a processor device coupled to the input, output, and memory devices, at least one of the input, output, memory, and processor devices comprising a semiconductor memory including:

a memory array;

a sense amplifier including a pair of sense nodes on which voltages, at least one of which is representative of a logic bit, can be present, and a pair of isolation switches coupled between the sense nodes and the memory array; and circuitry coupled to the sense amplifier for operating the isolation switches at less than a full activation level during stress testing of the semiconductor memory to conduct at least one of the voltages on the sense nodes at a reduced level through at least one of the switches to the memory array and thereby write the logic bit in a weakened state to the memory array.

34. A semiconductor wafer on which is fabricated a semiconductor memory comprising:

a memory array;

a sense amplifier including a pair of sense nodes on which voltages, at least one of which is representative of a logic bit, can be present, and a pair of isolation switches coupled between the sense nodes and the memory array; and circuitry coupled to the sense amplifier for operating the isolation switches at less than a full activation level during stress testing of the semiconductor memory to conduct at least one of the voltages on the sense nodes at a reduced level through at least one of the isolation switches to the memory array and thereby write the logic bit in a weakened state to the memory array.

* * * * *

UNITED STATES PATENT AND TRADEMARK OFFICE
CERTIFICATE OF CORRECTION

PATENT NO. : 5,959,913
APPLICATION NO. : 09/026245
DATED : September 28, 1999
INVENTOR(S) : Raad Page 1 of 1

It is certified that error appears in the above-identified patent and that said Letters Patent is hereby corrected as shown below:

COLUMN 4, LINE 61, change "VT" to --$V_T$--

COLUMN 5, LINE 49, after "to the" insert --memory--
COLUMN 9, LINE 18, after "to the" insert --memory--
COLUMN 10, LINE 30, after "of the" insert --isolation--

Signed and Sealed this

Eighth Day of August, 2006

JON W. DUDAS
*Director of the United States Patent and Trademark Office*